United States Patent [19]

Chevallier

[11] Patent Number: 5,579,356
[45] Date of Patent: Nov. 26, 1996

[54] TIMER CIRCUIT WITH PROGRAMMABLE DECODE CIRCUITRY

[75] Inventor: Christophe J. Chevallier, Palo Alto, Calif.

[73] Assignee: Micron Quantum Devices, Inc., Santa Clara, Calif.

[21] Appl. No.: 508,847

[22] Filed: Jul. 28, 1995

[51] Int. Cl.⁶ .................................................. H03K 5/12
[52] U.S. Cl. ........................ 377/20; 327/172; 327/294
[58] Field of Search ............................ 327/173–5, 294, 327/172; 377/20

[56] References Cited

U.S. PATENT DOCUMENTS

| | | | |
|---|---|---|---|
| 4,584,494 | 4/1986 | Arakawa et al. | 327/176 |
| 4,620,312 | 10/1986 | Yamashita | 327/176 |
| 4,812,687 | 3/1989 | Larson et al. | 327/263 |
| 5,003,194 | 3/1991 | Engelhard | 327/173 |
| 5,047,664 | 9/1991 | Moyal | 307/303 |
| 5,130,582 | 7/1992 | Ishihara et al. | 327/392 |
| 5,371,770 | 12/1994 | Sakuma | 327/291 |
| 5,469,100 | 11/1995 | Wuidart et al. | 327/263 |

Primary Examiner—Margaret Rose Wambach
Attorney, Agent, or Firm—Limbach & Limbach, L.L.P.

[57] ABSTRACT

A timer circuit for providing output pulses of an adjustable duration based upon stored decode parameters. The circuit has a timer element which generates a periodic timing signal. Preferably the frequency of the periodic timing signal is also adjustable. A frequency divider is clocked by the timing signal and provides a plurality of frequency divided outputs. A decode circuit combines selected ones of the frequency divided outputs based upon decode parameters and generates a timer circuit output pulse having a duration determined by the frequency divided outputs selected by the decode parameters. The decode parameters are stored in a non-volatile data storage unit so that the timer output pulse will remain the same after power interruption.

19 Claims, 8 Drawing Sheets

TIMER CIRCUIT WITH PROGRAMMABLE DECODE CIRCUITRY

BACKGROUND OF THE INVENTION

1. Field of the Invention

The present invention relates generally to timer circuits and, in particular, to timer circuits having programmable decode circuitry capable of providing adjustable duration timing pulses.

2. Background Art

In many integrated circuits, there is a requirement that certain functions be carried for a relatively precise time period. By way of example, in flash memory systems, the memory cells are programmed and erased by application of certain voltages to the flash memory cells for a fixed duration of time. A typical programming pulse may have a duration on the order of one microsecond. A typical erase pulse may have a duration on the order of one to a hundred milliseconds.

In addition, the characteristics of flash memory cells may vary from memory to memory, even for memories having a common design. Much of these variations are due to processing variations and other well known factors which affect the characteristics a memory and which are not readily controllable. Because of these variations in memory characteristics, the voltage pulses used in carrying out the memory functions such as programming are set to a value which will take into account such variations in characteristics. However, the pulse durations are not optimized to take into account the particular characteristics of a given memory. Thus, memory performance is reduced.

The present invention pertains to a timer circuit which, while capable of providing a wide range of pulse durations ranging from the microsecond range to the millisecond range, also provides the capability of generating a large number of different pulses, each having a duration which can be precisely adjusted. This latter feature permits, for example, the pulse widths to be selected after fabrication so that the characteristics of the memory may be taken into account. These and other advantages of the present invention will become apparent to those skilled in the art upon a reading of the following Detailed Description of the Invention together with the drawings.

SUMMARY OF THE INVENTION

A timer circuit is disclosed which includes a timer element which generates a periodic timing signal. Preferably the frequency of the periodic timing signal is adjustable. A frequency divider is included, typically implemented in the form of a counter circuit, having a plurality of stages, with each stage dividing the input by two. The frequency divider is responsive to the periodic timing signal for providing a plurality of frequency divided outputs.

The timer circuit is further provided with decode circuit means for combining selected ones of the frequency divided outputs based upon decode parameters and generating a timer circuit output pulse having a duration determined by the selected ones of the frequency divided outputs. Typically, the decode circuit means includes a multiplexer which receives the frequency divided outputs, either directly or in combination form, and outputs one of the received signals in response to the decode parameters. The decode parameters are stored in a non-volatile data storage unit so that the output pulse duration will be retained after power to the timer circuit has been interrupted.

DETAILED DESCRIPTION OF THE INVENTION

Figure 1:
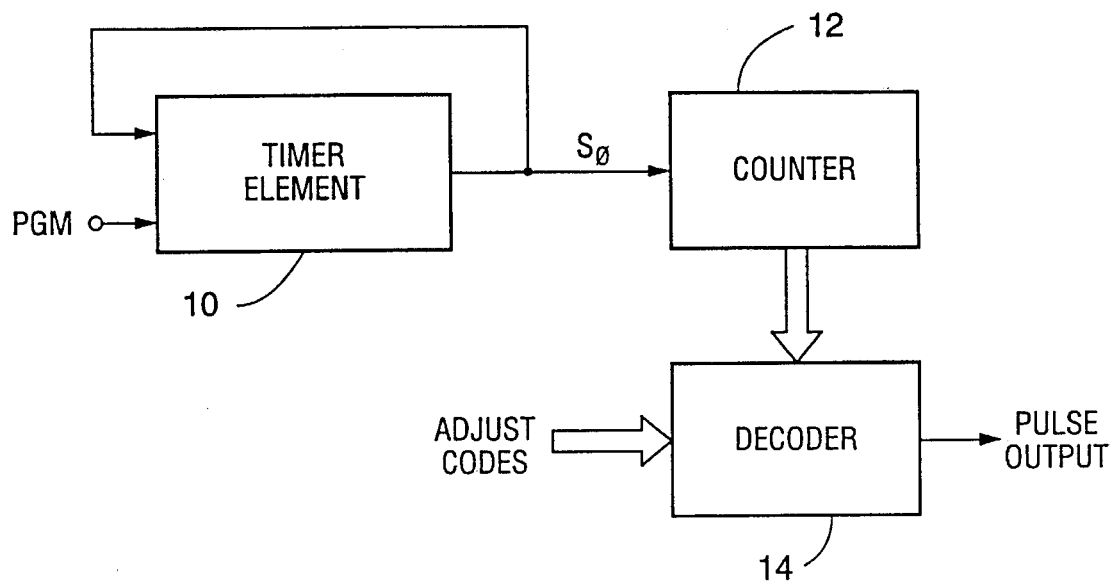
FIG. 1 is a block diagram of the subject timer circuit incorporated into a timer system.

Referring to the drawings, FIG. 1 is a block diagram of the subject adjustable timer circuit which is adapted for incorporation into a flash memory system. The timer circuit includes a timer element 10 for generating an output pulse $S_O$ which occurs a relatively precise time period after the timer circuit is triggered. The output pulse $S_O$ is fed back to an input of the timer element 10 so that the timer element can retrigger itself. In addition, the output pulse $S_O$ is used to clock a counter 12, with the counter having multiple outputs for driving a programmable decoder 14. The decoder 14 provides a pulse output, the duration of which is a function of certain stored parameters which control the decoder.

Timer element 10 is itself programmable based upon the memory operation to be performed. In the event a pulse is to be used to program a memory cell, program signal PGM will be active and cause the output $S_O$ to have a duration on the order of one to a hundred microseconds. In the event an erase operation is to take place, signal PGM will be inactive and the timer element $S_O$ will have a duration on the order of one to a hundred milliseconds.

Figure 2:
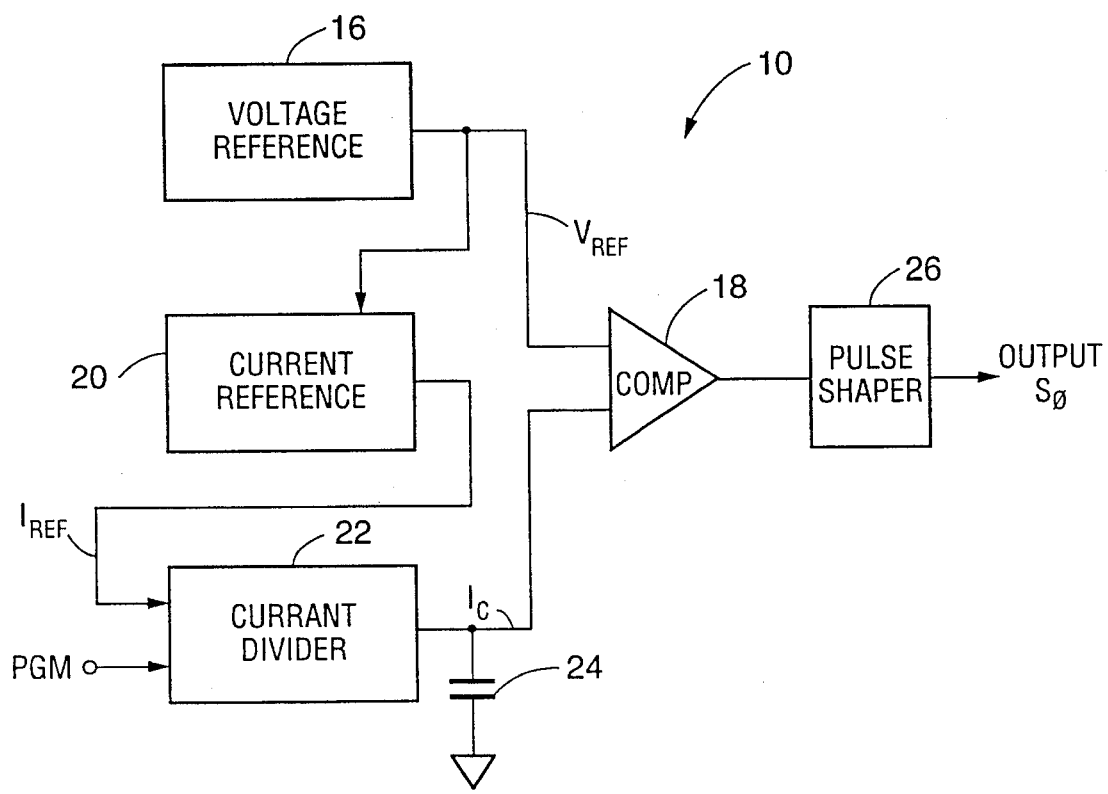
FIG. 2 is a block diagram of the subject timer circuit.

FIG. 2 shows additional details of the timer element 10 of FIG. 1. The timer element includes a voltage reference which produces a reference voltage $V_{REF}$ which is forwarded to a current reference stage 20. The current reference stage 20 produces a reference current $I_{REF}$ based upon the reference voltage $V_{REF}$ which is received by a current divider stage 22. The current divider provides an output current $I_C$, the magnitude of which is controlled by the program signal PGM which is used to charge a timing capacitor 24.

A comparator 18 is included which compares the voltage drop across timing capacitor 24 with the reference voltage $V_{REF}$. Current $I_C$ has a fixed magnitude which produces a ramp voltage across timing capacitor 24 with a fixed rate of change with respect to time. Thus, the duration of the pulse output of comparator 18 will be relatively constant and will be dependent essentially only on the value of $V_{REF}$ and the value of timing capacitor 24. The output of the comparator 18 is conditioned by pulse shaping circuitry 26 to provide the timer element output $S_O$.

Figure 3:
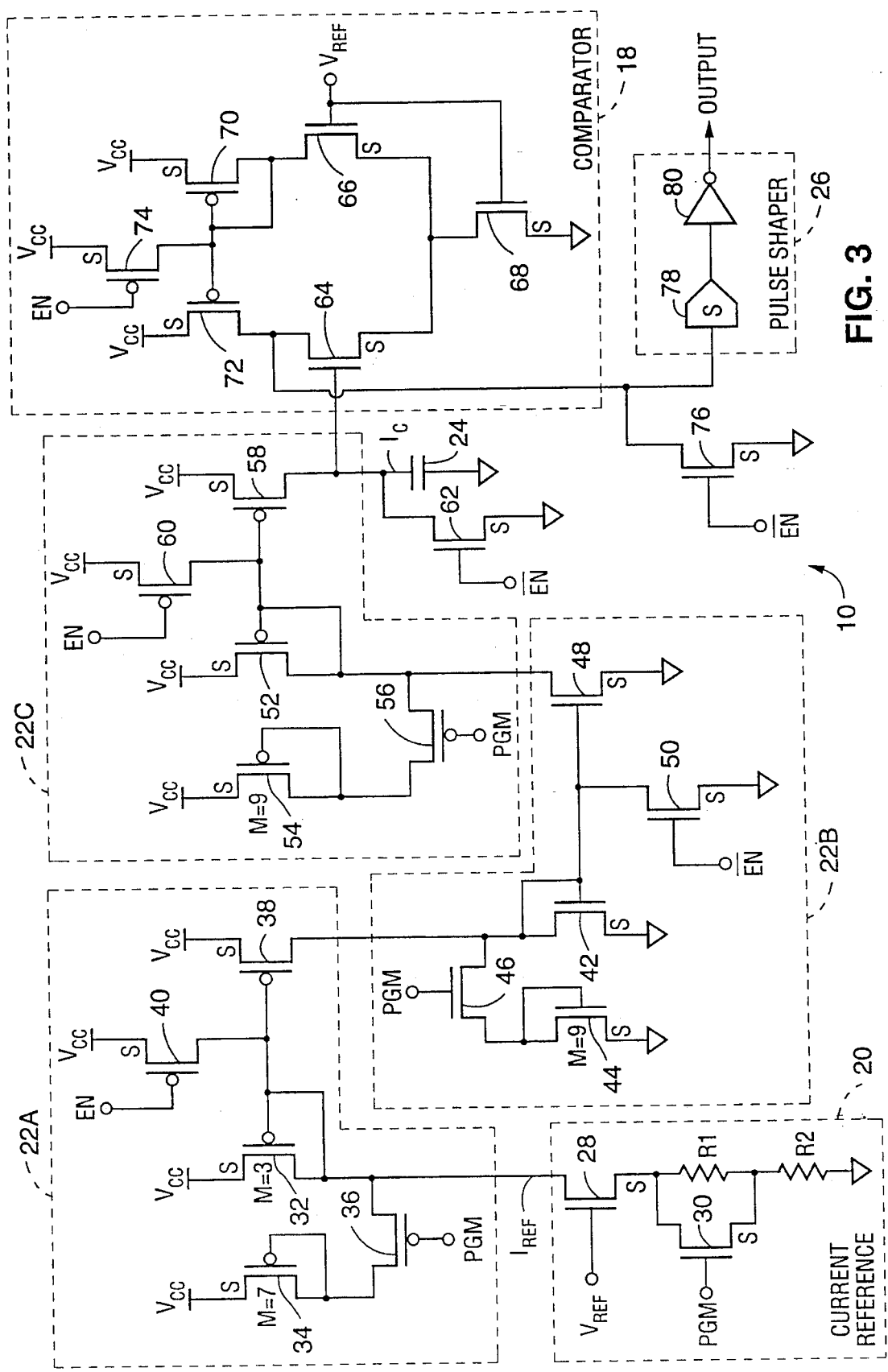
FIG. 3 is a detailed schematic diagram of the principal components of the subject timer circuit.

FIG. 3 shows additional details of the timer element 10. The current reference 20 receives the reference voltage $V_{REF}$ which is connected to the gate of an N channel transistor 28. The source of transistor 28 is connected to the series connection of resistors R1 and R2. A second N channel transistor 30 is connected across resistor R1 and has its gate connected to the program signal PGM. The voltage across resistors R1 and R2 is equal to the reference voltage $V_{REF}$, less the gate-source voltage of transistor 28. The magnitude of the reference current $I_{REF}$ is determined by the voltage across resistors R1 and R2 and the value of those resistors.

Voltage $V_{REF}$ may be generated by any suitable reference voltage generator circuit and is constant with respect to the power supply voltages of memory system, including primary supply voltage $V_{cc}$, and temperature and process variations. In order to make the gate-source voltage of transistor 28 to be close to the threshold voltage of that device, transistor 28 is made to be relatively large in terms of the ratio of the channel width to length (W/L). In addition, the magnitude of the reference current $I_{REF}$ through the transistor 28 is maintained at a relatively low value in the range of 0.1 milliamperes so that the gate-source voltage will approach the threshold voltage.

Resistors R1 and R2 are made to have relatively small resistances, in the range of 10 kohm to 20 kohm total resistance. Large value resistances have relatively long lengths compared to their widths and are susceptible to minor variations in width due to the so-called edge effect. This sensitivity is reduced by using smaller values of resistors where the total value of resistance is less susceptible to variations in width. The total resistance is made to be small since a wide resistor, which also has a large overall resistance, will occupy an unduly large amount of die area.

When the memory system is in a programming mode, signal PGM is high so that resistor R1 is effectively shorted out. This will cause the value of the reference current $I_{REF}$ to increase to a program reference current $I_{REFP}$. As will be explained, the high signal PGM will also change the operation of the current divider 22 so that the charge current $I_C$ in the program mode is further increased. The increase to the program reference current $I_{REF}$ in combination the increase in current due to the change in operation of the current divider 22, will cause the value of the charge current $I_C$ to increase thereby reducing the duration of the time period from the triggering of the timer element 10 to the generation of the pulse output $S_O$ during programming to a period on the order of one microsecond.

When the memory system is in the erase mode, signal PGM is low and transistor 30 is off. Thus, the effective resistance will be the sum of R1 and R2 and the value of the reference current $I_{REF}$ will be reduced to the erase reference current $I_{REFE}$. In addition, the operation of the current divider 22 will change so as to further decrease the charge current $I_C$. These two factors will cause the charge current $I_C$ to be reduced thereby increasing output pulse duration so that time period from the triggering of the timer element 10 to the generation of the pulse output $S_O$ is on the order of one millisecond.

The two reference currents $I_{REFP}$ and $I_{REFE}$ differ by only approximately 10% in magnitude, therefore the adjustment of inserting or deleting resistor R1 is only used as a trim feature. As will be explained, the large difference in the final timing capacitor 24 charging current when PGM is active versus inactive is achieved by way of the current divider 22.

As can be seen from the foregoing, it is desirable to make the reference current $I_{REF}$ small so that the pulse duration is large. However, it is difficult to fabricate a stable large resistance due to the aforementioned edge effect, without using a very large amount of die area. Accordingly, the reference current $I_{REF}$, as will be explained in greater detail, is further reduced by the current divider 22 (FIG. 2), with the current divider being programmable to provide a first charge current $I_{CP}$ during programming operations and a second charge current during non-programming operations, $I_{CE}$, such as erase. The current divider 22 is implemented so that the program charge current $I_{CP}$ is equal to the reference current $I_{REFP}$ divided by one thousand during the programming mode. In addition, the divider 22 is implemented so that the erase charge current $I_{CE}$ is equal to the erase reference current $I_{REFE}$ divided by three.

The current divider 22 of the timer element 10 includes a first stage 22A, a second stage 22B and a third stage 22C. Each of the current mirror stages includes a mirror input and a mirror output. The first stage 22A includes a mirror input comprising three identical P channel transistors connected in parallel (M =3) which are represented by transistor 32. Transistor 32 is connected as a diode with its drain and gate connected together and has its source connected to the primary supply voltage $V_{CC}$. The first stage 22A mirror input further includes seven identical P channel transistors (M =7) connected in parallel which are represented by transistor 34. Transistor 34 is also connected as a diode with the drain and gate connected together and the source connected to the primary supply voltage $V_{CC}$.

Transistors 32 and 34 have their drains coupled together by a P channel transistor 36 connected as a pass transistor. When the program signal PGM applied to the gate of transistor 36 is inactive (low), the transistor is on, effectively connecting the seven transistors 34 in parallel with the three transistors 32 so as to provide a mirror input of ten transistors. When PGM is active (high), the mirror comprises the three transistors 32. The ten individual transistors which make up transistors 32 and 34 are sometimes referred to as sub-transistors.

The mirror output of stage 22A includes a single P channel transistor 38 having its gate connected to the gates of transistors 32 and its source connected to the primary supply voltage. Transistor 38 is identical to the ten transistors which make up transistors 32 and 34. A P channel enable transistor 40 is connected between the gates of transistors 32 and 38 and the primary supply voltage $V_{CC}$. An enable signal EN is connected to the gate of transistor 40 which is active high. Thus, when the enable signal is active, transistor 40 is off and when it is inactive, transistor 40 is conductive thereby disabling current mirror stage 22A.

In operation, the input of current mirror stage 22A is caused to draw current $IRE_F$ through the drain-sources of the three sub-transistors which make up transistor 32 by current reference 20 when program signal PGM is active (transistor 36 is off). This causes a corresponding gate-source voltage to be produced in transistors 32. This gate-source voltage is dropped across transistor 38 causing current $I_{REF}$ to be mirrored in that transistor. All of the four transistors 32 and 38 will draw the same amount of current, $I_{REF}/3$. Accordingly, the current out of the current mirror first stage 22A, the current flow through transistor 38 will be $I_{REF}/3$.

If the program signal PGM is inactive, thereby indicating an erase operation (among others), transistor 36 is conductive. In that event, reference current $I_{REF}$ will be equally divided among the ten sub-transistors which make up transistors 32 and 34 of the input. Thus, the current in the output transistor 38 will be equal to that of any one of the input transistors, namely, $I_{REF}/10$.

Thus, since the ten transistors 32 and 34 of the first current mirror stage 22A are of the same construction and have the same ratio of channel width to channel length, the input of the current mirror stage can be viewed as being a single transistor having an effective ratio of channel width to channel length which is can be precisely controlled relative to the ratio of channel width to channel length of the output transistor 38. Such precision is due, in part, to the fact that it is possible to make multiple transistors which are almost identical to one another. In one instance, when PGM is active (transistor 36 is off), the value of the input transistor ratio relative to the value of the output transistor ratio is precisely three to one. When PGM is inactive, transistor 36 is conductive and the value is precisely ten to one.

The output of the first stage 22A of the current divider (transistor 38) is connected to the input of the second current mirror stage 22B. The input of stage 22B includes a single N channel transistor 42 connected as a diode. Transistor 42 may be selectively connected in parallel by way of transistor 46 to nine (M =9) N channel subtransistors 44, each also connected as a diode. Transistor 46 is controlled by the inverted program signal $\overline{PGM}$. Thus, when the program signal PGM is active, signal $\overline{PGM}$ is inactive (high) thereby turning on transistor 46 so that the mirror input comprises a total of ten identical transistors 42 and 44. When signal $\overline{PGM}$ is active (low), the mirror input comprises one transistor 42.

The mirror output of the second stage 22B is single transistor 48 having its gate connected to the gates of the transistors of the mirror input. An N channel transistor 50 is connected between the gates of transistors 42 and 48 and the circuit common and has its gate connected to the inverse of the enable signal EN, signal $\overline{EN}$. Thus, when the circuit is enabled, signal $\overline{EN}$ is low thereby causing transistor 50 to remain off, otherwise transistor 50 is conductive and functions to disable the second current mirror stage 22B.

Since transistors 42 and 48 are each single transistors and since transistor 44 comprises nine sub-transistor, the second stage functions to divide the input current to the second stage by either ten if the inverted program signal $\overline{PGM}$ is inactive (high) or by one if the signal is active.

The output of the second current mirror stage 22B, the drain of transistor 48, is connected to the input of the third mirror stage 22C. The input of the third stage includes the drain of single P channel transistor 52 and the drains of nine (M=9) P channel transistors 54 if transistor 56 is made conductive by an inactive program signal PGM. Single P channel transistor 58 forms the output of the third stage. Thus, the third mirror stage will divide the input current by ten if the program signal PGM is active and will divide by one if the signal is active.

In summary, if the program signal PGM is inactive, the output of the current divider 22, current $I_{CE}$ is $I_{REFE}/1000$. If the program signal is active, the output of the current divider, current $I_{CP}$ is $I_{REFF}/3$. Currents $I_{CE}$ and $I_{CP}$ are used to charge timing capacitor 24. An N channel transistor 62 is connected across timing capacitor 24 and functions to hold the capacitor in a discharged stage when the inverted enable signal $\overline{EN}$ is inactive (high). When the signal $\overline{EN}$ is active, timing capacitor 24 is charged by the output current $I_C$ of the current divider, with $I_C$ being equal to either $I_{CE}$ or $I_{CP}$ depending upon whether the program signal PGM is active.

The timer element 10 further includes the comparator circuit 18. The voltage across timing capacitor 24 is connected to one input of the comparator circuit 18. Circuit 18 includes a pair of differentially-connected N channel input transistors 64 and 66. The common source connection of transistors 64 and 66 is connected to a tail current source in the form to an N channel transistor 68. Current source transistor 68 is biased by the reference voltage $V_{REF}$.

Comparator circuit 18 further includes a pair of P channel transistors 70 and 72 connected as current mirror loads for the input transistors 64 and 66. Transistor 70 has its gate and source connected together and to the gate of transistor 72 and to the drain of another P channel transistor 74, with the source of transistor 74 connected to supply voltage $V_{CC}$. The gate of transistor 74 is connected to the enable signal EN which is active high. Thus, when active, signal EN will turn transistor 74 off and when inactive, will turn transistor 74 on thereby disabling comparator circuit 18.

The reference voltage $V_{REF}$ is connected to the remaining input of the comparator circuit, the gate of transistor 66. Thus, when the voltage across timing capacitor 24 is less than $V_{REF}$, the output of the comparator circuit 18 at the common drains of transistors 64 and 72 is at a relatively high level and when the capacitor voltage is slightly higher than the reference voltage, the output of the comparator circuit 18 is at a relatively low level.

The output of comparator circuit 18 is connected to the input of pulse shaper circuit 26. Circuit 26 includes a Schmidt trigger circuit 78. When the output of the comparator circuit is at the high level, the output of trigger circuit 78 is at a low level. When the comparator circuit drops down to a first threshold voltage, the output of the trigger circuit goes high. The rate of change of the voltage across timing capacitor 24 is slow so that the comparator circuit 18 will be in the region where it is switching states for a significant amount of time. Any noise present on the comparator inputs at this point is likely to cause the comparator to switch states. The trigger circuit 78 provides a degree of hysteresis so as to increase immunity to noise. Circuit 78 is implemented so that the threshold voltage is increased from the first voltage to a higher second threshold voltage. This helps to prevent the trigger circuit 78 output from changing back to the low state due to noise on the system.

The trigger circuit 78 output is inverted by an inverter 80 so that the output of the timer element 10 is a falling edge. An N channel transistor 76 is connected between the input of the pulse shaper circuit 26 and circuit common. The gate of transistor 76 is connected to the inverted enable signal $\overline{EN}$ so that the input of the pulse shaper circuit 26 will be functional when the enable signal $\overline{EN}$ is present and grounded when it is not present.

Figure 4:
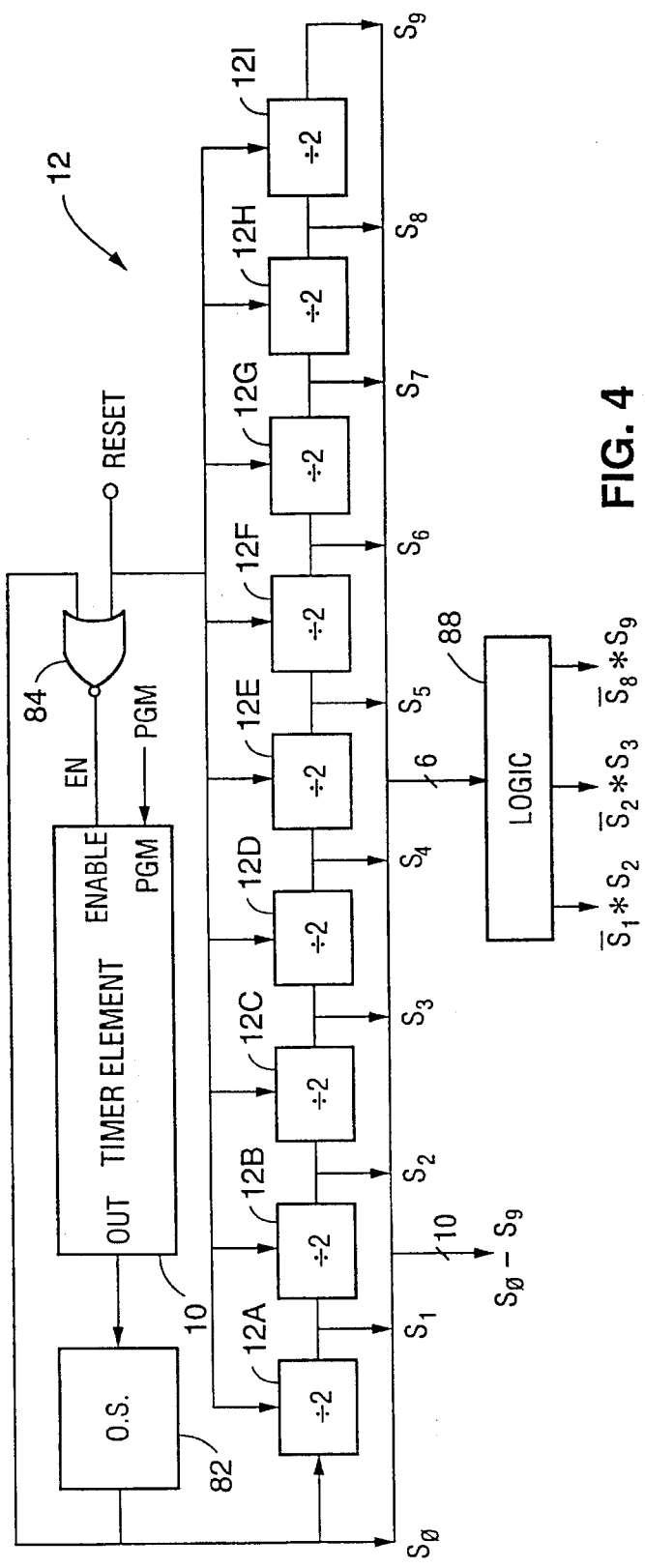
FIG. 4 is a detailed schematic diagram of the frequency divider and part of the decoder circuitry to be used in connection with the timer element of the present invention.

Referring to FIG. 4, the timer element 10 output is forwarded to a one shot circuit 82 which produces a short output pulse $S_0$ (typically 50 nanoseconds) on the falling edge of the timer element 10 output. Thus, signal $S_0$ is produced at the termination of each timer element 10 time period. When the timer element 10 is switched to the program mode (signal PGM is active), the output of the timer element 10 has a duration of 1.5 microseconds. When the timer element is in a non-program mode (signal PGM is inactive), the output of the timer element 10 has a duration of 0.4 milliseconds. This difference in three orders of magnitude is attributable the difference in the magnitude of the timing capacitor charging current $I_C$ for programming $I_{CP}$ and for non-programming $I_{CE}$. This difference is achieved by both the programmable current divider 22 (divide by 3 or divide by 1000) and the insertion and removal of resistor R1 from the current reference 20 (FIG. 3).

The output of the one shot 82 (FIG. 4) is fed back to the enable input of timer element 10 by way of a NOR gate 84. Thus, when signal $S_0$ is active (high), the enable signal EN goes momentarily inactive ($\overline{EN}$ active) thereby causing, among other things, transistor 62 (FIG. 3) to turn on. This will cause timing capacitor 24 to be discharged. Once the enable signal EN goes active at the end of the short duration pulse produced by one shot 82, the timer element will proceed to charge capacitor 24 again so that a further timer element 10 output will be produced. This process will continue unless the memory system generates a signal Reset which is applied to a second input of NOR gate 84 (FIG. 4). As long as signal Reset is present, signal enable EN will remain inactive (low) forcing the timer element to remain in a reset state.

The output of one shot 82, signal $S_0$, is coupled to the input of counter 12 (FIG. 4) which has nine stages 12A–12I. Each stage includes a D type flip-flop having an output connected back to the input so as to provide a divide-by-two function. The counter 12 thus produces nine timing outputs $S_1$–$S_9$ which are forwarded to various decoding circuitry. The counter 12 stages are each reset by signal Reset. The decoding logic includes a Logic element 88 which receives five of the timing signals ($S_1$, $S_2$, $S_3$, $S_8$ and $S_9$) from counter 12. The Logic elements logically combines the six timing signals to provide three decoded outputs including $\overline{S_1}*S_2$, $\overline{S_2}*S_3$ and $\overline{S_8}*S_9$ (*=AND). As will be explained in greater detail, these outputs are selected to provide certain desired predetermined output pulse widths for carrying out memory operations such as programming.

Figure 6:
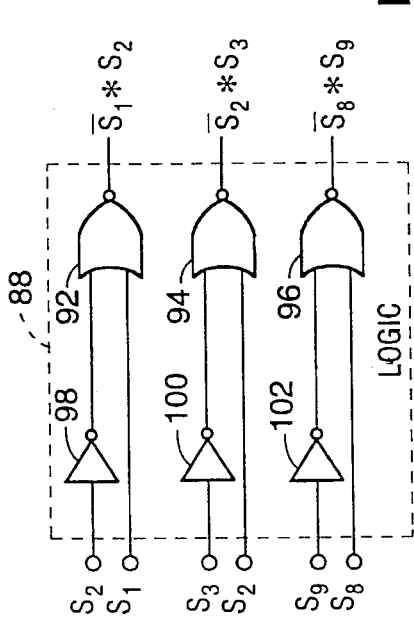
FIG. 6 is a detailed schematic diagram of part of the decoder circuit of the FIG. 4 diagram.

FIG. 6 shows the implementation details of the Logic element 88. The element includes three NOR gates 92, 94 and 96 and three inverter. The six timing signals $S_N$ are coupled to the appropriate inputs to the logic gates to provide the three outputs. By way of example, timing signal $S_2$ is connected to inverter 98, the output of which is connected to one input of NOR gate 92. Timing signal $S_1$ is connected to the second input of the NOR gate 92 the output of which is signal $\overline{S_1}$ and $S_2$ ANDed together ($\overline{S_1} * S_2$).

The exemplary memory system provides a total of three types of pulses used in memory operations. Pulses are provided for Programming operations and Erasing operations. In addition, pulses are provided for operations which are performed for the purpose of reducing the distribution of erased threshold voltages after an erase operation has been completed. This type of operation, sometimes referred to as a Heal operation, requires pulses having a duration on the order of those used in memory erase operations. Thus, the timer element 10 is placed in the non-program state (PGM inactive) when Heal operations are to be performed.

Figure 5:
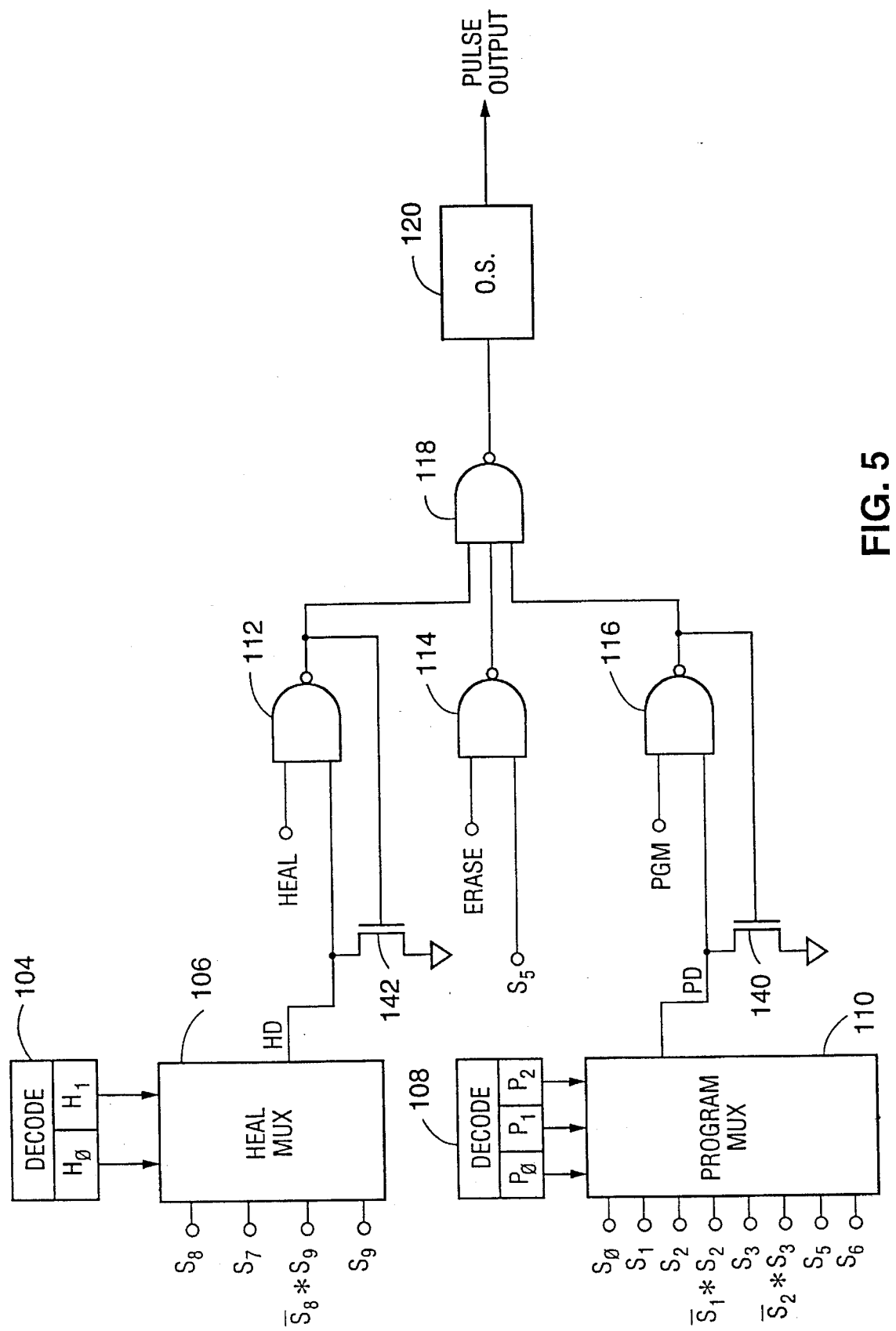
FIG. 5 is a more detailed schematic diagram of part of the decoding circuitry used in association with the subject timer circuit.

FIG. 5 depicts the circuitry for generating the particular pulses used in the Programming, Erasing and Heal memory operations. As will be explained, the duration of the individual pulses can be controlled in order to optimize the pulse width for the particular memory system. The memory Ease operation timing signal is not adjustable in the disclosed exemplary embodiment. Decode $S_5$, taken directly from stage 12E of counter 12, is connected to one input of a two-input NAND gate 114. The second input is connected to a signal ERASE which is active when a memory Erase operation is to be performed. The output of gate 114 is connected to one input of a three input NAND gate 118. The falling output of gate 114 functions to trigger a one shot 120 causing a 50 nanosecond pulse to be produced thereby indicating the end of the erase pulse. During an Erase operation, signal PGM is inactive so that the timer element 10 will output a pulse $S_0$ having a duration of 0.4 milliseconds. Decode $S_5$ will provide an output $2^5$ (32) times the period of the output pulse $S_0$ period of 0.4 milliseconds.

The Heal pulse widths are adjustable and can range from 50 milliseconds to 200 milliseconds. The particular pulse width is based upon the value of two bits of stored programmable parameters $H_0$ and $H_1$. Parameters $H_0$ and $H_1$ are preferably stored in two non-volatile flash memory cells represented by element 104. Alternatively, the parameters could be stored in a non-volatile data storage unit as will be subsequently described in connection with FIGS. 9 and 10.

Table 1 below shows the four combinations of parameters $H_0$ and $H_1$ and the corresponding decodes and pulse durations. A Heal multiplexer 106 is used to select one of four possible decodes based upon the two parameters $H_0$ and $H_1$. The output HD of Heal multiplexer 106 is connected to one input of two-input NAND gate 112. The second input to the NAND gate is a signal Heal which is produced by the memory system when the

TABLE 1

| DECODE (Heal) | | PULSE WIDTH |
|---|---|---|
| $H_0$ | $H_1$ | (milliseconds) |
| 0 | 0 | 100 |
|   |   | [$S_8$] |
| 0 | 1 | 50 |
|   |   | [$S_7$] |
| 1 | 0 | 150 |
|   |   | [$\overline{S_8} * S_9$] |
| 1 | 1 | 200 |
|   |   | [$S_9$] | memory system is performing a Heal operation. The output of gate 112 is connected to a second input of three-input NAND gate 118. Thus, when signal Heal is active, one shot 120 is triggered by a selected one of the four possible Heal decodes.

The decode circuitry further includes a Program multiplexer 110 used to select one of eight possible decodes for use in memory program operations. The selected decode is based upon parameters $P_0$, $P_1$ and $P_2$ also preferably stored in three non-volatile memory cells represented by element 108. Table 2 below shows the eight combinations of parameters $P_0$, $P_1$ and $P_2$ and the corresponding output pulse widths used in memory programming operations.

TABLE 2

| DECODE (program) | | | PULSE WIDTH |
|---|---|---|---|
| $P_0$ | $P_1$ | $P_2$ | (microseconds) |
| 0 | 0 | 0 | 6 |
|   |   |   | [$S_2$] |
| 0 | 0 | 1 | 4.5 |
|   |   |   | [$\overline{S_1} * S_2$] |
| 0 | 1 | 0 | 3 |

TABLE 2-continued

| DECODE (program) | | | PULSE WIDTH |
|---|---|---|---|
| $P_0$ | $P_1$ | $P_2$ | (microseconds) |
| 0 | 1 | 1 | $[S_1]$ 1.5 |
| 1 | 0 | 0 | $[S_0]$ 9 |
| 1 | 0 | 1 | $[\bar{S}_2 * S_3]$ 12 |
| 1 | 1 | 0 | $[S_3]$ 48 |
| 1 | 1 | 1 | $[S_5]$ 96 |
| | | | $[S_6]$ |

The output PD of the Program multiplexer 110 is connected to one input of a two-input NAND gate 116, with the second input being connected to receive an active signal PGM when the memory is to perform a program operation. The decode is forwarded by way of gate 118 to one shot 120 and triggers the one shot on its falling edge. Thus, depending upon the stored parameters $P_0$, $P_1$ and $P_2$, the program pulse outputs will vary as set forth in Table 2 above.

Figure 7:
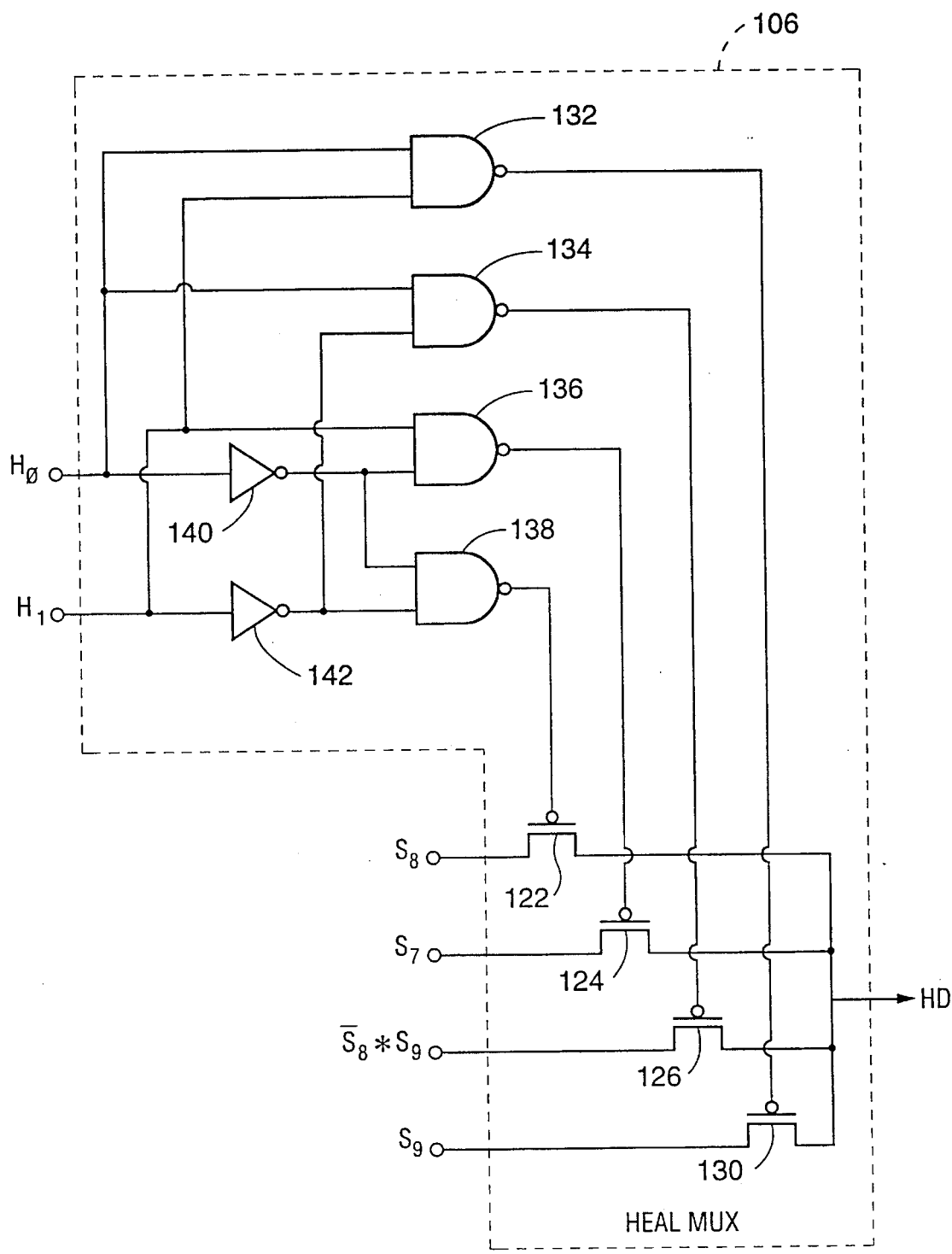
FIG. 7 is a detailed schematic diagram of one of the multiplexer circuits of the FIG. 5 diagram.

FIG. 7 shows a schematic diagram of the Heal multiplexer 106. The Program multiplexer 110 is implemented in a similar manner. The multiplexer 106 includes four P channel pass transistors 122, 124, 126 and 130 which are selectively enabled depending upon the stored parameters $H_0$ and $H_1$ so as to pass the selected decode to the output HD of the multiplexer. Four NAND gates 132, 134, 136 and 138 and two inverter 140 and 142 are used for decoding the parameters $H_0$ and $H_1$ and enabling one of the four NAND gates 132, 134, 136 and 138 based upon the parameters. By way of example, if the parameters $H_0$ and $H_1$ are logic 0 and 1, respectively, both inputs to NAND gate 136 will be a logic 1 so that the logic 0 (low) output of gate 136 will turn pass transistor 124 on. Transistor 124 will forward decode $S_7$ to the multiplexer output HD. The other NAND gates 122, 126 and 130 will all have high (logic 1) outputs under these conditions.

When one or both of the multiplexers 106 and 110 are coupling a low logic level signal, the output of the multiplexers (HD or PD) will be at one threshold voltage above ground due to the fact that the pass transistors include only P channel devices rather than both P and N channel devices. Small geometry transistors 140 and 142 (FIG. 5) are provided for pulling the multiplexer outputs down to approximately ground level under these conditions so that the multiplexer outputs HD and PD are at the proper low level. Transistors 140 and 142 are rendered conductive by the high outputs of NAND gates 112 and 116, respectively, with the outputs of these gates being high when the outputs of the respective multiplexers 106 and 110 are at one threshold voltage above ground potential.

The Heal parameters $H_0$ and $H_1$ and the Program parameters $P_0$, $P_1$, and $P_2$ are selected so as to optimize the performance of the memory system. By way of example, a particular lot of memory integrated circuits may be such that the flash memory cells of the memory array can be most efficiently programmed by application of a pulse of 9 microsecond duration. This would typically be determined at the memory fabrication facility. In that event, the parameters $P_0$, $P_1$, and $P_2$ would be selected to be 1, 0 and 0, respectively as indicated by Table 2. These value will be permanently programmed into the three non-volatile flash memory cells at the fabrication facility. If, for example, preliminary evaluation of a subsequent lot of memory integrated circuits indicates that the optimum pulse duration for programming is 100 microseconds, all that is required is to program 1, 1 and 1 for parameters $P_0$, $P_1$ and $P_2$, respectively, as indicated by Table 2.

Figure 8:
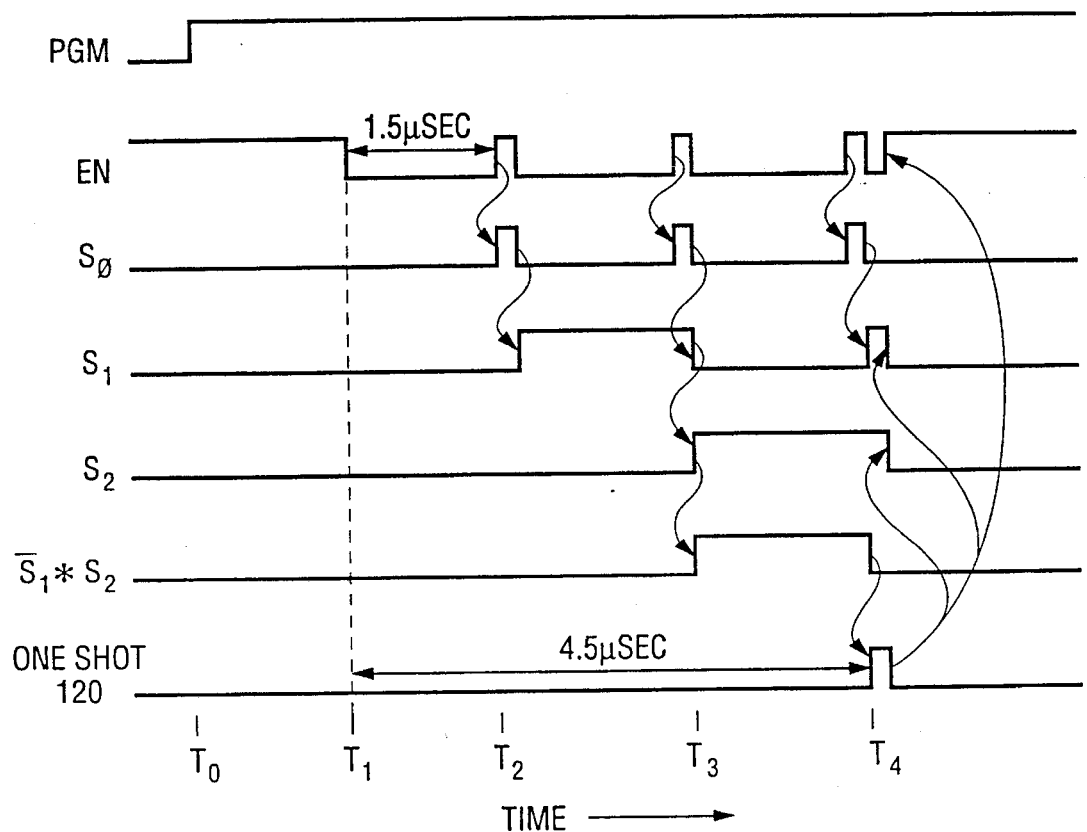
FIG. 8 is a timing diagram illustrating the operation of the timer element and an exemplary decoder output.

FIG. 8 is a timing diagram which further illustrates the operation of the subject invention. FIG. 8 shows the manner in which the 4.5 microsecond pulse is produced in a programming operation. As indicated in Table 2, the stored parameters $P_0$, $P_1$ and $P_2$ are 0, 0 and 1, respectively for producing a programming pulse of this duration. At time $T_0$, signal PGM is made active thereby indicating that one of programming outputs of Table 2 is to be produced. The stored parameters (block 108 of FIG. 5) will cause multiplexer 110 to select decode $\bar{S}_1 * S_2$.

At time $T_1$, signal $\overline{EN}$ is made active (low) by the generation of reset signal Reset (FIG. 4). The current mirror 22 begins to function and the transistor 62 (FIG. 3) which was shorting the timing capacitor 24 is turned off so that the capacitor will begin to be charged by current $I_{CP}$ and the voltage across the capacitor will begin to increase. This is the beginning of the generation of the 4.5 microsecond timing pulse, at which time the programming voltages are applied to the flash memory cell being programmed.

At time $T_2$, the voltage across the timing capacitor 24 is equal to the reference voltage $V_{REF}$. One shot circuit 82 will then issue a pulse in the form of signal $S_0$. Signal $S_0$ is fed back to the timer element by way of NOR gate 84 to generate a subsequent signal $\overline{EN}$. The time period from the falling edge of $\overline{EN}$ at time $T_0$ to the rising edge of the next signal $\overline{EN}$ (or the rising edge of signal $S_0$) is 1.5 microseconds. This sequence is periodically repeated so that subsequent signals $S_0$ are produced at time $T_3$, $T_4$, etc.

Signal $S_0$ clocks counter 12, with counter output $S_1$ changing states at the falling edge of signal $S_0$ thereby providing a signal with a nominal period of 3 microseconds as can be seen in the FIG. 8 diagram. Similarly, counter output $S_2$ changes state on the falling edge of output $S_1$ thereby providing a signal with a nominal period of 6 microseconds. The logical combination of $\bar{S}_1 * S_2$ is equivalent to subtracting 1.5 microseconds (signal $S_1$) from 6 microseconds (signal $S_2$) to arrive at the final 4.5 microsecond value The falling edge of the decode $\bar{S}_1 * S_2$ out of multiplexer 110 triggers one shot 120 by way of gates 116 and 118. Thus, the rising edge of the one shot 120 (or the falling edge of decode $\bar{S}_1 * S_2$) represents the termination of the 4.5 microsecond time period.

Figure 9:
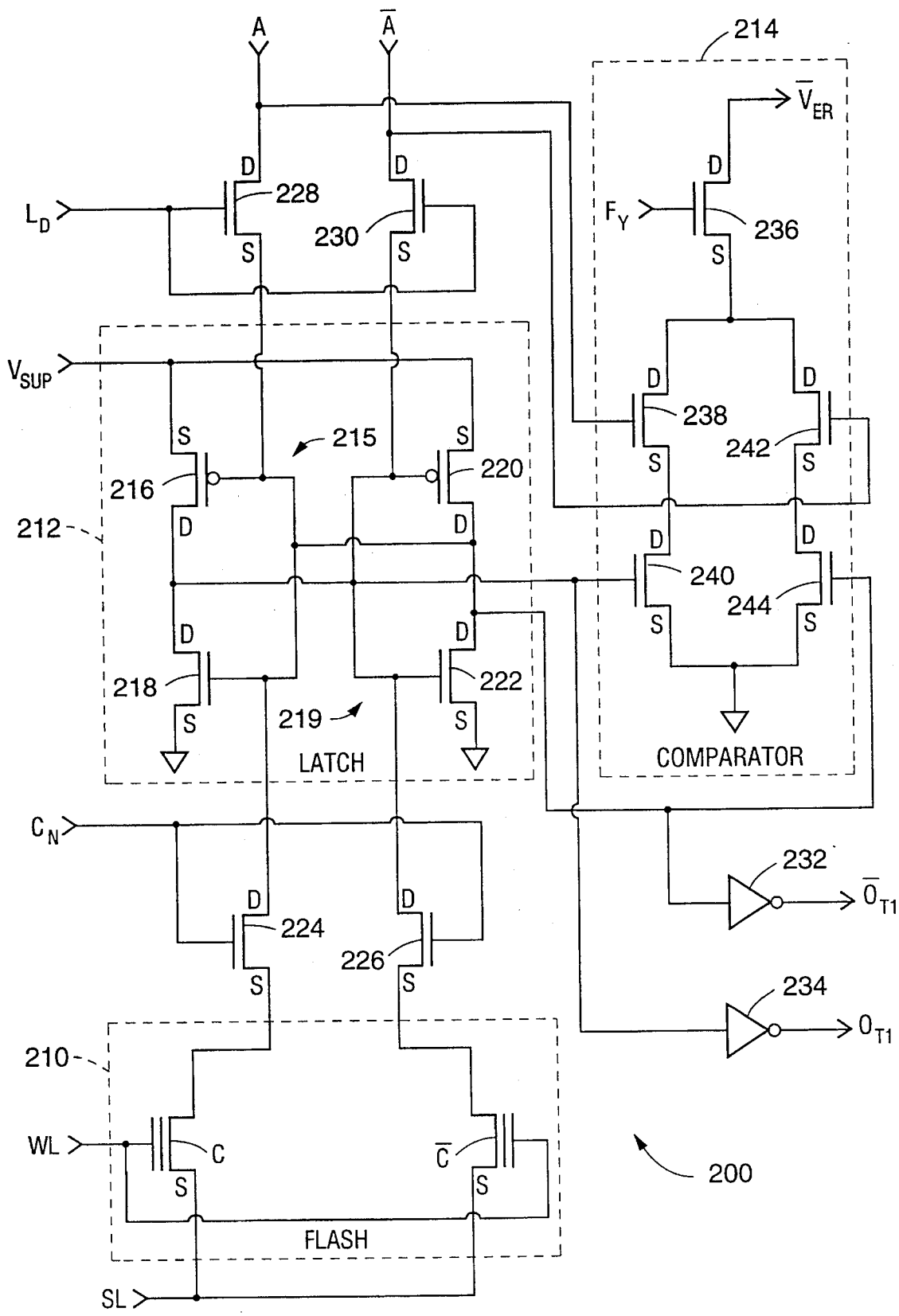
FIG. 9 is a schematic diagram of a data storage unit which can be used for storing the parameters for controlling the timer element decoder.
Figure 10:
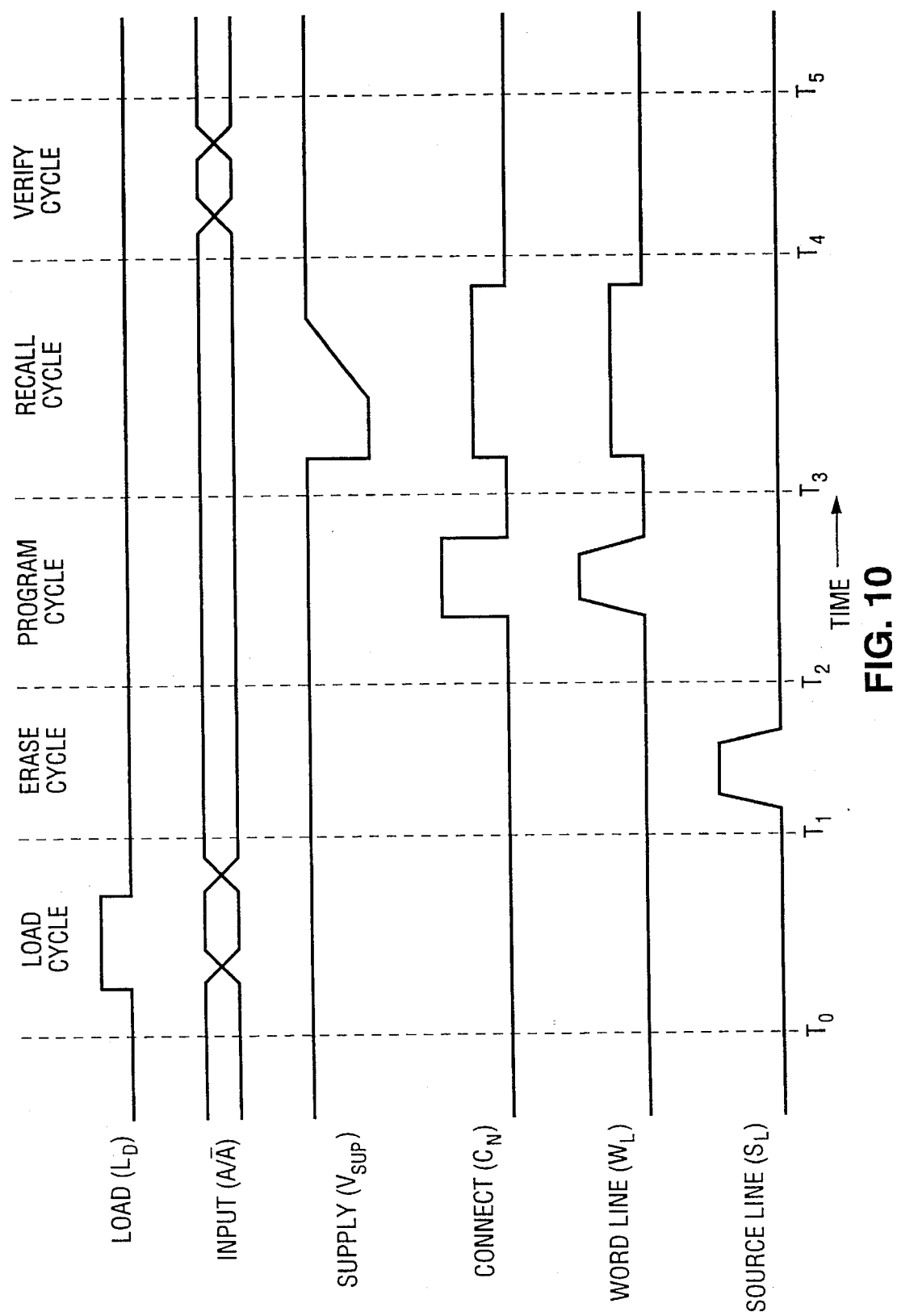
FIG. 10 is a timing diagram illustrating the operation of the FIG. 9 data storage unit.

As previously noted, parameters are preferably stored in some form of non-volatile medium. FIG. 9 is a schematic diagram of a data storage unit, generally designated by the numeral 200 that can be used for this purpose, although other forms of storage can be used. FIG. 10 is a timing diagram illustrating the operation of the FIG. 9 data storage unit.

Data storage unit 200 is capable of storing a single bit of parameter data. Multiple bits can be stored by simply providing a separate storage unit for each bit. The storage unit 200 includes a non-volatile memory or Flash section 210, a volatile Latch section 212 and a Comparator section 214. The flash section includes a pair of flash memory cells C and $\overline{C}$ for storing one bit of parameter data in complementary form. As is well known, a flash cell utilizes a floating gate transistor having a drain, source, floating gate and control gate. Data is stored in the cell by adding or removing charge from the floating gate. Erasure is accomplished by removing charge by way of Fowler-Nordheim tunneling from the floating gate through a thin gate oxide disposed intermediate the floating gate and the cell channel.

The flash cells have their common source regions connected to a common source line which receives signal $S_L$ and their control gates connected to a common word line which receives signal $W_L$.

The Latch section 212 includes a pair of cross-coupled inverters which form a latch circuit. A first inverter 215 includes a P channel transistor 216 connected in series with an N channel transistor 218. The common drain connections of transistors 216 and 218 form the output of the inverter and the common gate connection form the input. The second inverter 219 includes a P channel transistor 220 connected in series with an N channel transistor 222. The common drain connection of transistors 220 and 222 form the output of the second inverter 219 and the common gate connection forms the input.

As previously noted, the two inverters of the Latch section 212 are connected to form a latch circuit. In particular, the output of the first inverter 215, the common drain connection of transistors 216 and 218, is connected to the input of the second inverter 219, the common gate connection of transistors 220 and 222. The output of the second inverter 219, the common drain connection of transistors 220 and 222, is connected back to the input of the first inverter 215, the gates of transistors 216 and 218.

The output of the first inverter 215 of the Latch section 212 is connected to the drain of flash cell $\overline{C}$ by way of a N channel transistor 226 and the output of the second inverter 219 is connected to the drain of flash cell C by way of N channel transistor 224. The gates of the two connect transistors 224 and 226 are connected to a common control line which carries signal $C_N$.

The Latch section 212 is powered by applying a voltage $V_{SUP}$ to the sources of transistors 216 and 220. As will be explained, the magnitude of the voltage $V_{SUP}$ can be controlled by conventional circuitry. Data to be loaded into the Latch section 212 is provided in complementary form A and $\overline{A}$ by way of N channel transistors 228 and 230. The common gates of the transistors 228 and 230 are connected to a line which receives a load signal $L_D$. Transistor 228 functions to couple data input A to the input of the first inverter 215 of Latch section 212 and transistor 230 functions to couple data input $\overline{A}$ to the input of the second inverter 219.

The two complementary outputs of the Latch section 212 are each coupled to respective inverters 232 and 234. The outputs of inverters 232 and 234 form the complementary outputs $\overline{O}_{T1}$ and $O_{T1}$ of the subject data storage unit. The outputs of the Latch section 212 are also coupled to respective inputs of a comparator circuit 214. The data inputs A and $\overline{A}0$ are also coupled to respective inputs of the comparator circuit 214. As will be explained, the comparator circuit 214 functions to compare the data stored in the Latch section 212 with the data inputs A and $\overline{A}$ so that the state of the latch circuit can be verified. Typically, the output of the Comparator section 214, signal $\overline{V}_{ER}$ is wire ORed to other Comparator sections 14 associated with other data storage units so that a single verification signal $\overline{V}_{ER}$ can be used to indicate whether there is a match between the contents of the Latch section 212 and the associated data inputs A and $\overline{A}$ among several of the subject storage units.

Comparator section 214 includes five N channel transistors 236, 238, 240, 242 and 244. Transistor 236 is coupled between the comparator output $\overline{V}_{ER}$ and the common drain connection of transistors 238 and 242. In addition, the gate of transistor 236 is connected to receive signal $F_V$ which is active when the state of the Comparator section 214 is to be sampled. Transistors 238 and 240 are connected in series, with the gate of transistor 238 connected to receive data input A and the gate of transistor 240 connected to receive the output of the first inverter 215 of Latch section 212. Similarly, transistors 242 and 244 are connected in series, with the gate of transistor 242 connected to receive data input $\overline{A}$ and the gate of transistor 244 connected to receive the output of the second inverter 219 of Latch section 212. As will be explained, when the complementary data inputs A and $\overline{A}$ match the respective complementary outputs of the two Latch section inverters 219 and 215, the output of the comparator circuit 214, $\overline{V}_{ER}$ will be high, otherwise the output will be low.

There are a total of five operations which the data storage unit 200 can perform, including Load, Erase, Program, Recall and Verify. These operations will each be described in connection with the timing diagram of FIG. 10 together with the schematic diagram of FIG. 9. As will be explained in greater detail, the flash cell C and $\overline{C}$ are programmed by first loading the programming data into the Latch section 212. In addition, the flash cells C and $\overline{C}$ are read by transferring the contents of the flash cells to the Latch section 212.

Load

The function of the Load cycle is to set the Latch section 212 to a known state based upon the complementary input data A and $\overline{A}$. The Load operation is required prior to the Program operation to ensure that the Latch circuit 212 is at the desired state.

The beginning of the Load cycle is indicated by time $T_0$. Following time $T_0$, the input data A and $\overline{A}$ is applied to the drains of transistors 228 and 230. Once the input data are stabilized, the load signal $L_D$ is made active thereby turning on transistors 228 and 230. In addition, the Latch section 212 supply voltage $V_{SUP}$ is maintained at its nominal primary supply voltage $V_{CC}$ level of +5 volts. Assuming, for example, that A is a high level, the input of the first inverter 215, the common gates of transistors 216 and 218 will be pulled up to a high level. At the same time, complementary signal $\overline{A}$ will be at a low level and will tend to pull the input of the second inverter 219, the gates of transistors 220 and 222, down to a low level by way of load transistor 230.

This combined opposing action on the inputs of the two inverters will force the output of the first inverter 215 to a low state and the output of the second inverter 219 to a high state. The Latch section 212 will hold or store this data until it is altered by a subsequent Load operation, until it is changed by a Recall operation (as will be explained) or until the power is removed from the system. Load transistors must be of sufficient size so as to be capable of forcing the Latch section 212 transistors to the desired state.

Erase

The operation for erasing the flash cells C and $\overline{C}$ commences at time $T_1$. This cycle is performed directly on the cells rather than by way of the Latch section 212. The connect signal $C_N$ is inactive in this operation so that both connect transistors 224 and 226 will be non-conductive. Thus, the drains of cells C and $\overline{C}$ will be left floating. In addition, signal $W_L$ connected to the word line of the two cells is grounded and the signal $S_L$ connected to the sources of the two cells is raised to a large positive voltage such as +12 volts. As is well known, under these conditions, the cells C and $\overline{C}$ will both be erased by way of Fowler-Nordheim tunneling. The Flash section 210 must then be appropriately programmed so that the cells C and $\overline{C}$ will store complementary data.

Program

The programming cycle commences at time $T_2$. As previously noted, the Latch circuit 212 must have been previously set to the desired programmed state of the Flash section 210. Load signal $L_D$ is inactive so that transistors 228 and 230 are off. The supply voltage $V_{SUP}$ is at a nominal value of +6 volts. Assume, for example, that the Latch section 212 had previously been set such that the output of inverter 215 is at a low level and the output of inverter 219 is at a high level. In that event, the drain of transistor 224 will be close to the supply voltage $V_{SUP}$ and the drain of transistor 226 will be close the circuit common.

The connect signal $C_N$ is made active (high) shortly after time $T_2$, thereby turning on transistors 224 and 226 and effectively connecting the supply voltage $V_{SUP}$ and circuit common to the drain of cells C and $\overline{C}$, respectively. The connect signal $C_N$ switches to a high level of +12 volts in the Programming cycle so that transistors 224 and 226 have a sufficient gate-source voltage to connect the supply voltage $V_{SUP}$ of +6 volts to either one of the drains of cells C and $\overline{C}$ depending upon the data stored in the latch. In this case, cell C will get the $V_{SUP}$ on its drain. At the same time, the control gates of the cells C and $\overline{C}$ are connected to word line signal. $W_L$ having a magnitude equal to +12 volts. In fact, in many cases $C_N$ and $W_L$ can be the same signal. The source line signal $S_L$ is at circuit common and is connected to the common sources of cells C and $\overline{C}$. This combination of voltages applied to cell C will cause the cell to be programmed whereas those applied to cell $\overline{C}$ will not result in programming of the cell. In order to enable the cells C and $\overline{C}$ to be programmed to opposite states, it is necessary to first erase both cells in an Erase cycle prior to performing the Programming cycle. As previously noted, the Latch circuit 212 must have also been previously set in order to carry out a Programming cycle.

Transistor 220 of inverter circuit 219 will provide the programming current, which is typically 500 microamperes, to cell C. If cell $\overline{C}$ is being programmed, the programming current is provided by transistor 216 of inverter circuit 215. Thus, transistors 216 and 220 of the Latch circuit 212 must be of sufficient size to be able to conduct these programming currents. As previously noted, transistors 228 and 230 must also be sized so that they have sufficient strength to force inverters 215 and 219 of the Latch circuit 212 to a desired state during the Load cycle. Typically, the programming voltages will be applied for a relatively long duration ranging from a few hundred microseconds to a millisecond. Since the data is stored in cells C and $\overline{C}$ in complementary form and since, as will be explained, the cells will be read in a differential manner, there is a large error tolerance margin.

Accordingly, it is not necessary to perform any type of program verification as is frequently done in flash memory systems to confirm that the data has been properly programmed.

Recall

The Recall cycle is illustrated in FIG. 10 diagram beginning at time $T_3$. In this operation, the complementary states of cells C and $\overline{C}$ are transferred to the Latch section 212. When power is removed from the data storage unit, the data is not retained in volatile Latch section 212. Accordingly, when power is reapplied, initialization circuitry is used to cause the transfer of the data stored in the non-volatile cells C and $\overline{C}$ to the Latch. section 212.

Since the flash cells C and $\overline{C}$ have a limited drive capability and would not normally have sufficient strength to force the transistors of the Latch section 212 to a desired state, the supply voltage $V_{SUP}$ is momentarily dropped to a low level approaching ground potential in the initial stage of the Recall operation. In addition, the connect signal $C_N$ is made active thereby connecting the Flash section 210 to the Latch section 212 by way of transistors 224 and 226. The word line of cells C and $\overline{C}$ is connected to a signal $W_L$ having a magnitude equal to the primary supply voltage $V_{CC}$ of typically +5 volts. Again, signals $W_L$ and $C_N$ can be the same signal for this operation.

The Recall cycle is preferably initiated by some form of power-on-reset circuit which will cause the Recall cycle to be performed at power on and when the primary supply voltage $V_{CC}$ drops to some predetermined level which would possibly affect the state of the Latch circuit 212. The Recall cycle is initiated by the power-on-reset circuit when the circuit has detected that the primary supply voltage $V_{CC}$ has ramped up to about +3 volts after initial power on or has ramped up to about +3 volts after a drop in voltage $V_{CC}$ below that level.

During the Recall cycle, the common source line signal $S_L$ is also set to ground potential. Assuming that cell C has been programmed and cell $\overline{C}$ is in an erased state, cell C will be non-conductive so that the input of inverter 215 of the Latch section 212 will not be affected. Cell $\overline{C}$ will be conductive and tend to pull the input of inverter 219 of the Latch section 212 down to ground potential.

Since the Latch. section 212 is not powered at this point, cell $\overline{C}$ is capable of pulling the input of inverter 219 down to a low level despite the limited drive capability of the cells. As can be seen from the FIG. 10 timing diagram, voltage $V_{SUP}$ is held to a low value momentarily and then is increased to the normal operating level. Preferably, the voltage is increased at a slow rate.

As the supply voltage $V_{SUP}$ increases, the cell $\overline{C}$ will continue to hold the input of inverter 219 at a low level so that P channel transistor 220 will proceed to turn on. This will cause the output of inverter 219 to be high which will, in turn, cause the input of inverter 215 to also be high. Thus, transistor 218 of inverter 215 will also begin to turn on thereby causing the output of inverter 215 to go low thereby reinforcing cell $\overline{C}$ in pulling down the input of inverter 219. Eventually, the supply voltage $V_{SUP}$ will be at the normal high voltage of $V_{CC}$ or typically +5 volts and the Latch circuit 212 will be in the desired state of indicating the state of the Flash section 210.

Even though cell $\overline{C}$ has a very small drive capability, by controlling the supply voltage $V_{SUP}$ as described, the cell is capable of forcing the Latch section 212 to the desired state. Programmed cell C will not have much, if any, tendency to pull the input of inverter 215 down and thus will not oppose the action of cell $\overline{C}$. However, even if the programmed threshold voltage of cell C approached the erased threshold voltage of cell $\overline{C}$, it can be seen that the cell with the largest cell current will still be able to control the state of the Latch circuit 212. This differential action enhances the reliability of the operation of the subject data storage unit. Note also that the outputs of inverters 215 and 219 are coupled to respective inverters 232 and 234 so that loading on the Latch section outputs will be equal. The Latch section will thus remain capacitively balanced so as to enhance the ability of the flash cells C and $\overline{C}$ to force the Latch section to any desired state.

Verify

As previously explained, the Verify cycle is used to determine the state of the Latch section 212. This operation can be used to determine the state of the Flash section 210 if it preceded by a Recall cycle. The Verify cycle utilizes the complementary data inputs A and $\overline{A}$ and compares them with the state of the Latch section 212. Comparator section 214 functions essentially as an exclusive NOR circuit and provides a logic low output $\overline{V}_{ER}$ in the event there is a match between the Latch section 212 and the data input A and $\overline{A}$.

By way of example, assume that a Verify cycle is to take place so that the verify signal $F_V$ is made active. This will cause transistor 236 of the Comparator section 214 to be conductive. Further assume that data input A is a logic "1" (high) so that $\overline{A}$ is a logic "0" (low). Still further assume that inverter 15 output of the Latch section 212 is a logic "0" so that the inverter 219 output will be a logic "1". Since input A is high and since the output of inverter 215 is low, transistor 238 of the Comparator 214 section will be conductive and transistor 240 will be off. Similarly, since input $\overline{A}$ is low and the output of inverter 219 is high, transistor 242 will be off and transistor 244 will be on. There is a pull-up device (not depicted) connected between the output of the Comparator section 214 and voltage $V_{CC}$. As a result of transistors 240 and 242 being off, there will be no conductive path between the source of transistor 236 and the circuit common. Accordingly, the output $\overline{V}_{ER}$ will remain in a high state ("1") indicating a valid compare.

If the outputs of inverters 215 and 219 were logic "1" and "0", respectively, and the data inputs A and $\overline{A}$ remain the same, transistors 238 and 240 will both be conductive. Thus, when transistor 236 is turned on by signal $F_V$, the output. $V_{ER}$ will be pulled down to a logic "0" indicating a no compare condition.

In the event the data inputs A and $\overline{A}$ are a logic "0" and "1", respectively, and the outputs of inverters 215 and 219 are a logic "1" and "0", respectively, transistors 238 and 244 will be off. Thus, signal $V_{ER}$ will be a logic "1" thereby indicating a valid compare. Continuing, if inputs A and $\overline{A}$ were a logic "0" and "1", respectively and inverters 215 and 219 were a logic "0" and "1", respectively, transistors 242 and 244 will be conductive so that signal $\overline{V}_{ER}$ will be at a logic "0", thereby indicating a no compare.

Figure 11:
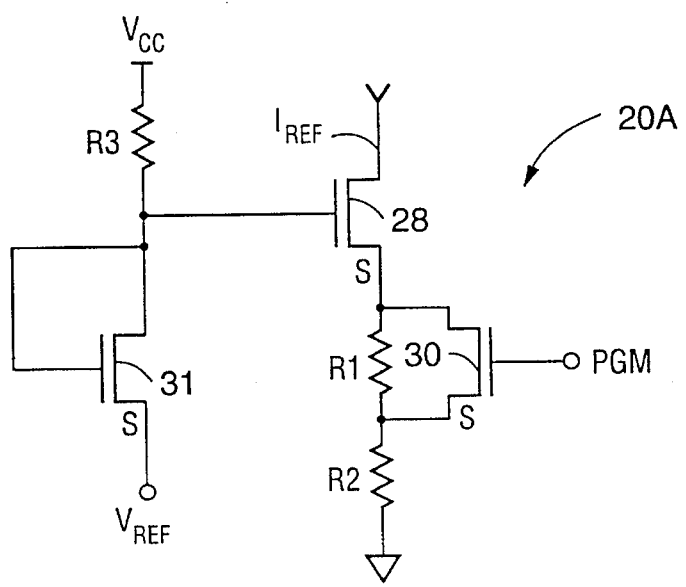
FIG. 11 is a schematic diagram of an alternative current reference circuit.

FIG. 11 depicts an alternative embodiment Current Reference 20A which provides a more stable reference current $I_{REF}$. The reference voltage is applied to the source of an N channel transistor 31, with transistor 31 having its drain and gate connected together. The drain of transistor 31 is connected to the primary supply voltage $V_{CC}$ by way of a resistor R3. The voltage at the gate/drain of transistor 31, which is equal to voltage $V_{REF}$ plus the threshold voltage of transistor 31, is applied to the gate of transistor 28. The voltage at the source of transistor 28 is equal to the gate voltage less the threshold voltage of transistor 28. Assuming that transistors 28 and 31 are the same size and conduct about the same amount of current, it can be seen that the threshold voltages cancel one another out so that the voltage across resistors R1 and R2 is equal to voltage $V_{REF}$. Thus, the reference current $I_{REF}$ through transistor 28 will be very stable and less sensitive to variations in transistor threshold voltages resulting from process variations and the like.

Thus, an adjustable timer circuit has been disclosed capable of providing a very wide range of accurate pulse widths has been disclosed. Although one embodiment has been described in some detail, it is to be understood that certain changes can be made without departing from the spirit and scope of the invention as defined by the appended claims.

I claim:

1. A timer circuit comprising:

a timer element which generates a periodic timing signal;

a frequency divider responsive to the periodic timing signal for providing a plurality of different frequency divided outputs;

decode circuit means for combining selected ones of the frequency divided outputs based upon decode parameters and generating a timer circuit output pulse having a duration determined by the selected ones of the frequency divided outputs; and a plurality of programmable non-volatile data storage units for storing the decode parameters.

2. The timer circuit of claim 1 wherein the decode circuit means includes first multiplexer means for receiving a first group of timing signals derived from the frequency divided outputs and selecting one of the timing signals of the first group, based upon a first group of the decode parameters, for generating the timer circuit output pulse.

3. The timer circuit of claim 2 wherein the first group of timing signals include timing signals derived from a logical combination of the frequency divided outputs.

4. The timer circuit of claim 3 wherein the first group of decode parameters includes two of the parameters.

5. The timer circuit of claim 2 wherein the decode means includes second multiplexer means for receiving a second group of timing signals derived from the frequency divided outputs and selecting one of the timing signals of the second group, based upon a second group of the decode parameters, for generating the timer circuit output pulse.

6. The timer circuit of claim 5 wherein the first group of timing signals include timing signals derived from a first logical combination of the frequency divided outputs and the second group of timing signals include timing signals derived from a second logical combination of the frequency divided outputs.

7. The timer circuit of claim 6 wherein the first and second groups of decode parameters each include two of the parameters.

8. A timer circuit comprising:

a timer element which generates a periodic timing signal;

an N stage frequency divider clocked by the timing signal and providing N frequency divided output signals;

first logic means for logically combining a first group of the frequency divided output signals to create a first group of combined signals;

a first multiplexer receiving a first combination of the frequency divided output signals and the first group of combined signals and outputting one of the received signals based upon a first group of decode parameters thereby generating a timer circuit output pulse of a first duration, with the first duration being dependent upon the first group of decode parameters; and a non-volatile data storage unit for storing the first group of decode parameters.

9. The timer circuit of claim 8 further including:

second logic means for logically combining a second group of the frequency divided output signals to create a second group of combined signals;

a second multiplexer for receiving a second combination of the frequency divided output signals and the second group of combined signals and outputting one of the received signals based upon a second group of decode parameters thereby generating a timer output pulse of a second duration, with the second duration being dependent upon the second group of decode parameters; and a non-volatile data storage unit for storing the second group of decode parameters.

10. The timer circuit of claim 9 wherein the first and second groups of decode parameters each include at least two of the parameters.

11. A timer circuit comprising:

a timer element which generates a periodic timing signal;

a frequency divider responsive to the periodic timing signal for providing a plurality of frequency divided outputs;

decode circuit means for combining selected ones of the frequency divided outputs based upon decode parameters and generating a timer circuit output pulse having a duration determined by the selected ones of the frequency divided outputs, with the decode circuit means including a first multiplexer means for receiving a first group of timing signals derived from a logical combination of the frequency divided outputs and with the decode means functioning to select one of the timing signals of the first group based upon a first group of the decode parameters for generating the timer circuit output pulse; and a plurality of programmable non-volatile data storage units for storing the decode parameters.

12. The timer circuit of claim 11 wherein the first group of decode parameters includes two of the parameters.

13. The timer circuit of claim 11 wherein the decode means includes second multiplexer means for receiving a second group of timing signals derived from the frequency divided outputs and selecting one of the timing signals of the second group based upon a second group of the decode parameters for generating the timer circuit output pulse.

14. The timer circuit of claim 13 wherein the first group of timing signals include timing signals derived from a first logical combination of the frequency divided outputs and the second group of timing signals include timing signals derived from a second logical combination of the frequency divided outputs.

15. The timer circuit of claim 14 wherein the first and second groups of decode parameters each include two of the parameters.

16. A method of generating a periodic output signal comprising the following steps:

generating a periodic clock signal:

generating a plurality of different frequency divided output signals from the periodic clock signals;

storing a plurality of decode parameters in non-volatile data storage units; and producing the periodic output signal by combining selected ones of the frequency divided outputs based upon the decode parameters.

17. The method of claim 16 wherein the step of producing the periodic output signal includes the steps of generating a first group of timing signals derived from the frequency divided output signals and selecting one of the timing signals from the first group based upon a first group of the decode parameters.

18. The method of claim 17 wherein the step of generating the first group of timing signals includes the step of logically combining the frequency divided output signals.

19. The method of claim 18 wherein the step of producing the periodic output signal includes the steps of generating a second group of timing signals derived from the frequency divided output signals and selecting one of the timing signals from the second group based upon a second group of the decode parameters.

* * * * *